United States Patent [19]

Rischke et al.

[11] Patent Number: 5,372,699
[45] Date of Patent: Dec. 13, 1994

[54] METHOD AND APPARATUS FOR SELECTIVE ELECTROPLATING OF METALS ON PRODUCTS

[75] Inventors: Jorg W. Rischke, Veldhoven; Tom Thomassen, Be Geffen, both of Netherlands

[73] Assignee: Meco Equipment Engineers B.V., Hertogenbosch, Netherlands

[21] Appl. No.: 943,577

[22] Filed: Sep. 11, 1992

[30] Foreign Application Priority Data

Sep. 13, 1991 [NL] Netherlands ................. 9101544

[51] Int. Cl.$^5$ ................ C25D 7/06; C25D 17/06
[52] U.S. Cl. ................. 205/129; 204/224 R
[58] Field of Search ............. 205/118, 129, 130; 204/206, 224 R

[56] References Cited

U.S. PATENT DOCUMENTS 4,376,017 3/1983 Urion .................... 204/15
4,921,583 5/1990 Sewell .................. 204/129

FOREIGN PATENT DOCUMENTS 59-28591 2/1984 Japan .

Primary Examiner—John Niebling
Assistant Examiner—Brendan Mee
Attorney, Agent, or Firm—Oblon, Spivak, McClelland, Maier, & Neustadt

[57] ABSTRACT

This invention relates to a method and apparatus for selective electroplating of metals on metal or metallized products in an elongated strip. Use is made of an apparatus in which an assembly of a masking belt and the product strip are guided along means for exposing the products to an electrolyte. Masking belt and product strip have been provided with holes distributed in a regular pattern over their respective lengths, while driving means are provided lengthwise transport masking belt and product strip. By means of proximity sensors, signals are obtained which indicate the position of the holes in the masking belt and product strip in positions which, related to the direction of travel of belt and strip are situated up stream and nearby the means for exposing the products to an electrolyte.

When the signals obtained from the proximity sensors indicate a deviation from the targeted position of belt and strip in relation to each other, a relative move between masking belt and product strip lengthwise is effectuated by influencing the driving means.

14 Claims, 5 Drawing Sheets

METHOD AND APPARATUS FOR SELECTIVE ELECTROPLATING OF METALS ON PRODUCTS

BACKGROUND OF THE INVENTION

The invention relates to a method for selective electroplating of metals on metal or metallised products in an elongated strip by means of an apparatus in which a masking belt and the product strip together are guided against the periphery of a wheel or drum and along means for exposing the products to be plated to an electrolyte, whereby masking belt and product strip are both provided lengthwise with holes in a regular pattern, whilst drive means are provided for lengthwise transport of masking belt and product strip.

A similar method is proposed in U.S. Pat. No. 4,493,757. In this known method use is made of masking means, made of sections, which opposite each other are somewhat movable in the lengthwise direction of the masking means and whereby use is made of indexing pins which engage in transport holes provided in the product strip. By engaging the indexing pins in the transport holes it is aimed to obtain a correction for tolerance differences in the masking means and product strip due to inaccuracies during manufacturing and/or temperature difference between mask and product strip. A precise position of masking means in relation to the product strip is essential for accurately applying the metal deposits—mostly precious metal—on the predetermined positions. On the one hand such an accurate positioning of metal deposits, particularly of precious metals is desirable for economic reasons, on the other hand it can be required for further processing of the products, such as assembling the products in a printed circuit board by means of soldering or such whereby specific parts of the product should not be plated with precious metal but require a non-precious metal such as tin for solderability.

Technologies used hitherto and as described in the above mentioned patent were very satisfactory for the electroplating of leadframes for the production of integrated circuits and the like, which were stamped or photochemically etched and whereby the product strip consisted of an elongated strip of interconnected products.

Leadframes are for instance used to assemble a chip on a printed circuit board whereby such a leadframe contains a number of leads which on one end are connected with the chip and require a precious metal plating, mostly gold or silver, whereas the other end of the leads serves to connect the chip with e.g. a printed circuit board and usually requires a tin lead coating.

The increase of the number of functions of modern chip technology demands a dramatic increase in the number of connections to the chip and can go up to as much as 1,000. In addition there is a trend towards lighter weight of components.

To meet these requirements product strips have been developed whereby the metal products are supported by plastic film. In general such product strips with plastic film support are manufactured as follows:

a) Stamp transport or sprocket holes and windows in locations, where in the finished product strip no support of the metal products by the plastic film is desired, into a plastic film, for instance of polyimide or polyester with a thickness of 0.05–0.15 mm to which a dry adhesive film of approximately 0.025 mm had been laminated.

b) Laminate a metal foil, usually a copper foil with a thickness of 0.035 mm to the prestamped plastic adhesive film.

c) Apply a photo-sensitive liquid or dry resist to the metal foil, expose and develop the resist to the desired pattern of the metal product.

d) Chemically etch the metal foil so as to obtain the desired metal product pattern and strip the remaining photoresist to obtain a bare metal product surface.

An alternative method for manufacturing a product strip composed of metal products supported by a plastic film is obtained by direct laminating the metal foil, mostly a copper foil, with a plastic film without an intermediate adhesive layer. In this case the transport holes and windows in locations where the metal products must not be supported by the plastic film are obtained by photochemical etching of the supporting plastic film. The metal products are then formed as described above to obtain the product strip.

The described production processes can provide extremely delicate leadframes with a very high lead count. Such product strips are known in the industry as TAB films (TAB=Tape Automated Bonding).

A product strip obtained this way and consisting of a very thin plastic film, supporting the leadframe products formed there-on is very vulnerable and it will be clear that exposing the strip to high pulling forces will lead to unacceptable deformation of the leadframes. For this reason it was customary up to now to electroplate, usually with gold, the products all-over, which resulted in high cost, whilst as already indicated above, it not only is cheaper but also quality wise much better when parts of the leads are tin lead coated for making solder connections to a printed circuit or the like, instead of goldplated which after soldering often shows brittle solderjoints.

The industrial demand for these delicate leadframes with supporting plastic film is strongly increasing as is confirmed in "Electronic Packaging and Production", August 1986: "TAB rebounds as I/O increase" and in "Electronic Materials Report" February 1990: "Smart cards to fuel TAB growth".

In connection with the increased demand for TAB film structures it becomes important for the electroplating of these films to provide a system in which a masking belt and a product strip can be positioned accurately towards each other, without exposing the product strip to undesirable forces, so that precise electroplating of selective areas of the products can be effected, also when extremely delicate products, such as TAB film structures must be processed.

SUMMARY OF THE INVENTION

According to the present invention the production of an electroplated product can be accomplished by using a wheel or drum of which the surface which, in operation, will be in contact with the product strip or masking belt is provided with a layer of a material with a high coefficient of friction and whereby a first proximity sensor produces signals which indicate the position of holes in the masking belt which is kept under a constant tension by spring means, at a first location, which seen in the travelling direction of masking belt and product strip is placed up stream and nearby the wheel or drum and the means for exposing the product strip to the electrolyte and whereby a second proximity sensor produces signals which indicate the position of holes in the product strip, which is kept under constant tension by spring means, at a second location, which seen in the travelling direction of the masking belt and product strip is placed up stream and nearby the wheel or drum and the means for exposing the product strip to the electrolyte and whereby a deviation from the targeted position of masking belt and product strip in relation to each other signalled by the proximity sensors will result in a relative move between masking belt and product strip lengthwise by influencing the driving means.

When using the method of the present invention the proximity sensors will accurately detect the relative position of the masking belt and product strip, each of which is kept under constant tension, and the driving means which are instructed by the proximity sensors will cause, if necessary, only slight adjustments between product strip and masking belt to take place in order to correct the position of product strip and masking belt in relation to each other in the section where the product strip is exposed to the electrolyte and the electroplating takes place and guarantee correct positioning of the metal deposit by the relative move of masking belt and product strip in relation to each other. These relative movements between belt and strip can be made very accurate because one of the two rests against the high friction wheel surface and hence cannot be shifted. On the contrary, there will be a very thin water film between masking belt and product strip since the latter has undergone a pretreatment and rinse before being exposed to the selective plating operation, and therefore the friction between masking belt and product strip will be extremely low permitting an easy move from one versus the other. In practical operation it has been proven that very delicate products such as TAB leadframe structures, when very flexible masking belts are used, can be processed without any distortions or damages to the products nor will distortions of the masking belt take place.

It is noted that U.S. Pat. No. 4,376,017 discloses a method and apparatus whereby a product strip is transported linearly between a set of guide means. Pin shaped sections of the product strip protrude outside the guide means and parts of an endless masking belt are pushed into the openings between the pins. Relative movement of masking belt versus product strip is impossible. It is indicated that the travel speed of the product strip can be monitored by a sensor and the supply speed of the masking belt can be adjusted by the signals produced by the sensor. In practical operation this will result only in a more or less stretching of the masking belt in order to register the parts of the belt that must be inserted between the product pins correctly opposite the spaces between the pins. For delicate products this method is unsuitable.

Further, Patent Abstracts of Japan vol. 8, No. 114 (C-225) (1551) of May 26, 1984 discloses a method whereby a product strip and a masking belt are together linearly transported through a treatment chamber. Means for maintaining a constant tension on strip and belt are not provided. The apparatus is equipped with a single light source which must register the relative position of strip and belt versus each other by concerted action of the single light source with holes provided in the product strip and masking belt. A disadvantage of this method is that it is generally necessary to have the product strip or masking belt travel slightly behind the other because the actual position of strip and belt is determined by the degree of overlapping of the holes. Upon application of this invention the location of the strip can be determined by the position of the outer edges of the holes which should result in better accuracy.

An apparatus, particularly suitable for applying the method described before is provided with drive means and guide means to transport the product strip and concerting masking belt onto the periphery of a wheel and along means which expose the product strip to an electrolyte and means which for the relative positioning of masking belt and product strip act together with holes provided in belt and strip at regular distances and is according to the present invention characterized by the use of proximity sensors which act together with the holes in order to position belt and strip correctly towards each other, and which are placed relative to the direction of travel of the product strip up stream and nearby the means for exposing the product strip to an electrolyte and of which one registers the position of the product strip and the other of the masking belt, whereby adjustment means are provided which, depending upon the input signals received from the proximity switches instruct the driving means to provide a relative move between masking belt and product strip whereby spring means are provided to maintain a constant preset tension in both belt and strip and whereby the periphery of the wheel is provided with a layer of material with a high coefficient of friction.

When using an apparatus of this kind, products interconnected in an elongated strip, such as TAB structures or leadframes can be plated with a metal accurately on selective areas without subjecting the product strip to undesirable forces which could have caused deformations or damages to the products, whilst simultaneously a simple and appropriate construction of the apparatus is obtained.

When using the described method and apparatus high accuracy is necessary for the manufacturing of the masking belt in order to obtain an optimum cooperation between product strip and masking belt.

According to another objective of the present invention, a masking belt, to be used together with a product strip in which the metal products are supported by an adhering plastic film in which prior windows had been provided to expose certain areas of the metal foil and whereby after laminating the metal foil to the plastic film the desired products have been obtained by photochemical etching, is produced of the identical material as the plastic film of the product strip and in the same or similar thickness, whilst the required transport holes and windows are produced with the same means as those used for the production of the plastic carrier film for the metal foil.

Surprisingly using exactly the same plastic film for producing the masking belt as the film used for making the product strip is very successful, thereby using the same tools or apparatus for providing the holes and windows in the belt that are used for producing the product strip. This means that masking belt and plastic film for the product strip can be processed subsequently as one film for making the holes and windows, whereafter only the film which serves as the carrier for the products is laminated with metal foil. It is evident that in this manner a fast and economic production of both product strip and masking belt can be effectuated, even when only relatively short runs must be produced.

Yet another object of the present invention is to provide a method for selective electroplating of metal products interconnected in an elongated strip and whereby the product strip in concert with a masking belt are transported through an apparatus in which the areas of the metal products which are not covered by the masking belt are exposed to an electrolyte so as to obtain the desired plated metal patterns.

According to this invention a product strip is processed, in which the metal products are adhesively supported by a plastic film which has been provided with windows to expose certain areas of the metal foil and in which after laminating the metal foil to the plastic film the metal foil is transferred into the desired metal patterns by photo chemical etching and whereby this product strip consisting of plastic film and metal products is transported through an apparatus together with a masking belt, made of similar material as the plastic film of the product strip, and whereby perfect masking and excellent precision of the selectively plated areas was obtained. This permits the use of a masking belt manufactured in the same mode and with the same material and auxiliaries as are being used for the manufacturing of the product strip, which ultimately results in important reduction of the production costs.

Yet a further objective of the invention is to provide a particular appropriate apparatus for selective electroplating of metal products adhesively supported by a plastic film and connected in an elongated product strip, which apparatus is provided with wheel shaped guide means for guiding the interconnected elongated product strip along means for exposing the product strip to an electrolyte, in combination with a masking belt to mask areas of the elongated product strip where no metal deposition is required and whereby the masking belt is manufactured from for example poly-imide film with a thickness of 0.05–0.15 mm.

Using an apparatus as described permits even and continuous passage of the metal product strips supported by an adhering plastic film and whereby unacceptable deformation of the metal products is prevented notwithstanding the fact that the metal structures are only clamped between two identical very thin plastic films.

The invention will be further explained with the following figures.

DESCRIPTION OF THE PREFERRED EMBODIMENTS

Figure 1:
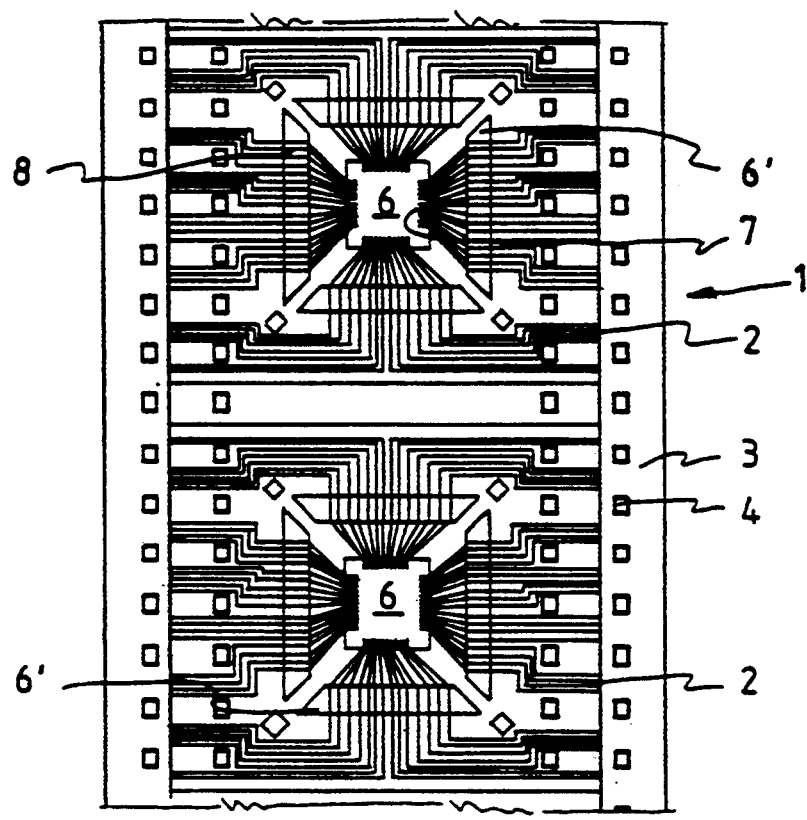
FIG. 1 shows a top view of two metal structures which are part of an elongated product strip of interconnected leadframes for the manufacturing of integrated circuits.

As has been mentioned before, such a product strip can be stamped from a metal strip, but for leadframes with a more complicated design or high lead count, supporting films 3 are used, often made of polyimide or polyester, in the lengthwise edges of which transport or sprocket holes 4 are stamped. In the example drawing of FIG. 1 windows 6 and $6^1$ have been further stamped out.

Onto the plastic film 3 a metal foil, usually a copper foil has been laminated and photochemically etched to develop the metal structures of leadframes 2 which comprise a large number of leads 7 at the location of windows 6 and a large number of leads 8 at the location of windows $6^1$.

The leads 7 are designed to be connected to certain points of a chip of an integrated circuit and require for this purpose a layer of precious metal, usually gold. For the leads 8 tinplating is often specified to facilitate solder operations into e.g. a printed wiring board of the finished integrated circuit.

Figure 2:
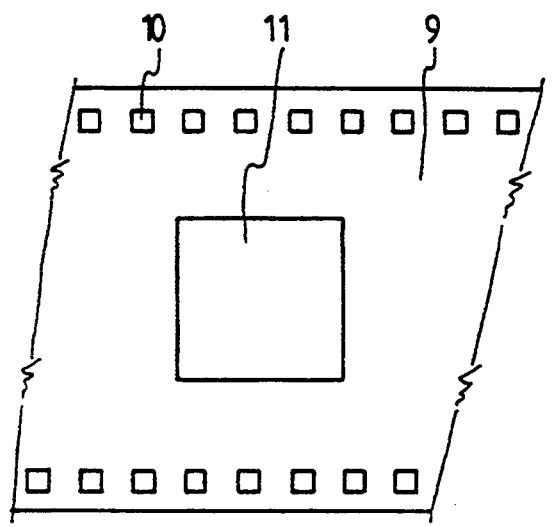
FIG. 2 shows a schematic view of a part of a masking belt.

For reasons of clarity the leadframes in FIG. 2 have only a low number of leads 7 and 8. In reality however products with very high lead counts are being used, as has been indicated before.

For applying a metal coating on the leads 7 situated in the windows 6 the product strip 1 can be processed together with a masking belt 9 of FIG. 2 through an apparatus for the selective electroplating of the desired metal. The masking belt 9 has been provided with transport or sprocket holes 10 which correspond with the transport holes 4 of product strip 1 and additionally with windows 11 in a regular pattern which corresponds with the windows 6 in the product strip 1 which means that when masking belt 9 and product. strip 1 travel through the apparatus for the selective electroplating only the leads 7 in the windows 6 are exposed to the electroplating process.

Such a masking belt 9 will be manufactured, just like masking belts discussed below, from the same material as the plastic film 3 and be provided in the same mode with e.g. transport holes 10 and windows 11 as the plastic film of product strip 1 has been provided with the holes 4 and windows 6.

For the selective electroplating of the leads 8 at the location of windows 6; the product strip 1 can travel together with the masking belt $9^1$ which has been provided with transport holes $10^1$ through an apparatus for selective electroplating.

Figure 3:
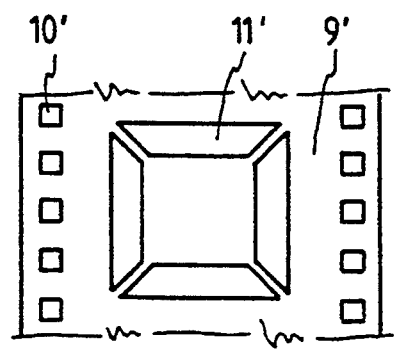
FIG. 3 shows a schematic view of an alternative type of masking belt.

Instead of the windows 11 corresponding with the windows 6 of product strip 1, the masking belt 9 $^1$ has been provided with windows $11^1$ corresponding with windows $6^1$ in product strip 1. It will be evident that when product strip 1 travels together with the masking belt of FIG. 3 through an apparatus for the selective electroplating only the leads 8 at the location of the windows $6^1$ will be exposed to the electroplating process.

Figure 4:
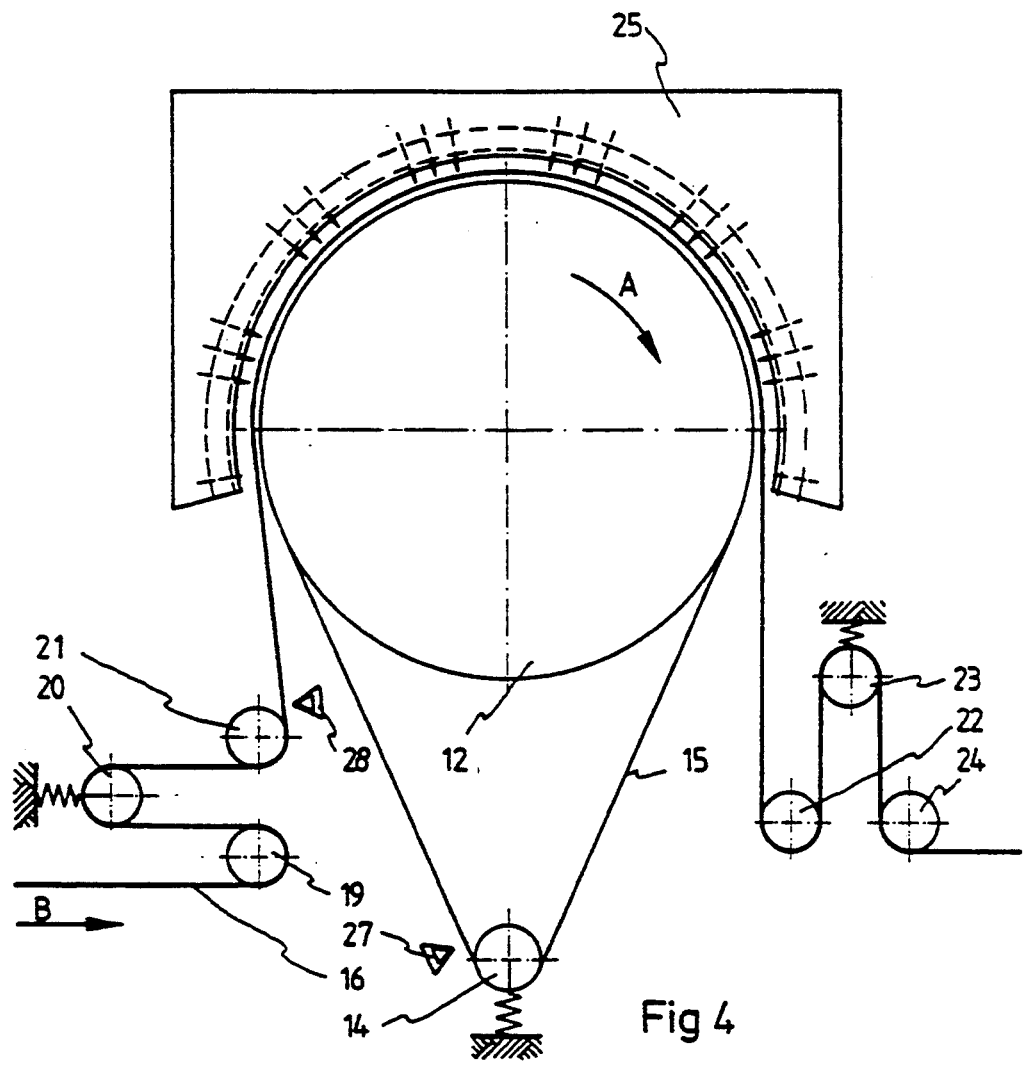
FIG. 4 shows a schematic view of an apparatus of the invention.

FIG. 4 shows schematically an example of an apparatus in which product strips as described above can be selectively electroplated. The basic principle of such an apparatus is known from U.S. Pat. No. 4,132,617 and will for this reason not be described in full detail here.

Figure 6:
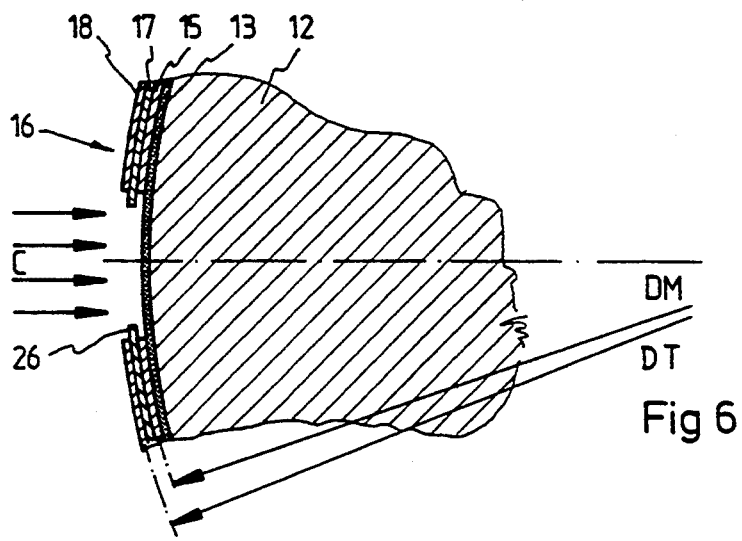
FIG. 6 shows schematically on a larger scale a cross section of a part of the wheel of the apparatus of FIG. 4 with the product strip and masking belt abutting against or extending of the wheel.

The apparatus is provided with a wheel 12, which, as indicated in FIG. 6 has been coated with a layer of material 13, which has a high coefficient of friction. An endless masking belt 15 is guided over wheel 12 and a tension wheel 14 is situated at some distance from wheel 12. The masking belt 15 corresponds with belt 9 or $9^1$ as described above.

The presence of friction layer 13 prevents slipping of masking belt 15 during operation with regard to wheel 12, so that it is guaranteed that masking belt 15 follows all movements of wheel 12 during operation.

Against the opposite side of masking belt 15 a product strip 16 corresponding with the product strip 1 described above is situated in such a way that the metal products or leadframes 17 are locked in between masking belt 15 and the plastic film 18 which is part of product strip 16 (FIG. 6).

During operation the wheel will rotate as indicated by arrow A and the product strip 16 will travel as indicated by arrow B. As indicated in the drawing the product strip is guided upon entry over three guide rollers, 19–21 of which guide roller 20 is movable under spring tension to maintain a desirable tension in product strip 16.

In a similar way product strip 16 is guided at the exit side of the apparatus over three guide rollers 22–24 of which guide roller 23 is movable under spring tension to maintain the desired tension of product strip 16 at the exit side.

At the location where the product strip is extending about or resting against wheel 12 a sparget 25 is positioned from which electrolyte can be jetted in the direction of the product strip 16 as indicated by arrows C in FIG. 6 and as in itself is well known in high speed plating technology.

In the sparger 25 an anode can be placed in the usual and known manner, whilst product strip 16 will be connected in the usual and known way, as a cathode, to the negative pole of a direct current source.

For those skilled in the art it will be clear that in this way only those areas of product strip 16 which are not protected by masking belt 15 and plastic film 18 of the product strip, hence the protruding leads 26, corresponding with the leads 7 of FIG. 1, will be plated with metal.

It will be further clear from FIG. 6 that the leadtips 16 which require goldplating can be well contacted all around with electrolyte because masking belt 15 keeps these leadtips at a distance from the outside of friction layer 13 of wheel 12. Surprisingly it has been found that in practical use of the apparatus the gold thickness on all sides of the leadtips was approximately equal.

However, should it be found that when using other specific electrolytes for metal deposition that thickness differences appear between the opposite sides of leadtips 26, the wheel 12 can be provided with apertures at the location of windows 11 of masking belt 15, permitting the supply of electrolyte and direct current from both sides towards leads 26.

At the location of guide rollers 14 and 21 optical sensors 27 and 28 are placed for detection of the position of masking belt 15 and product strip 16 respectively. In the construction form described here, the optical sensors act in concert with the transport or sprocket holes 4 and 10 or $10^1$ for detection of the position of the leads to be plated of the products 2 (FIG. 1) in relation to the position of the windows 11 or $11^1$ in the masking belt.

When now a deviation of the aimed position is detected by the sensors a relative shift of position between masking belt and product strip is brought about by decelerating or accelerating masking belt or product strip.

Figure 5:
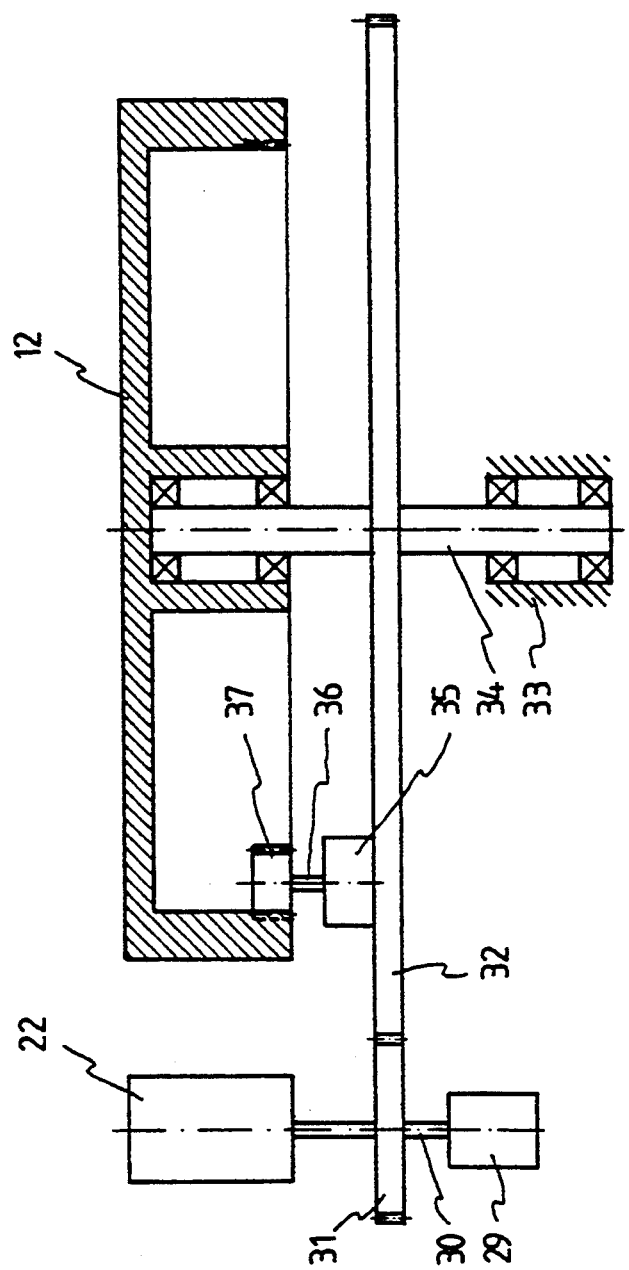
FIG. 5 shows schematically the drive means of the apparatus of FIG. 4.

FIG. 5 shows schematically a possible construction for bringing about such a relative shift of position.

The guide roller 22, driving product strip 16 is for example driven by motor 29. On the shaft 30, which connects motor 29 with guide roller 22, a gear wheel 31 is fixed. This gear wheel 31 meshes with a further gear wheel 32, which is fixed onto a shaft 34 which can rotate in a bearing fixed in frame 33. The wheel 12 can freely rotate in a bearing at one end of shaft 34.

Further a motor 35 is fixed onto gear wheel 32. To the shaft 36 of this motor a pinion wheel is fixed, which is meshed with the internal teeth of wheel 12.

When motor 29 is switched on it will directly rotate guide roller 22 which effectuates the transport of product strip 16 whilst gear wheel 32 with shaft 34 is rotated by gear wheel 31.

When motor 35 is not energized, shaft 36 and pinion wheel 37 will be stationary and wheel 12 will be rotated with a rotation speed equal to the rotation speed of shaft 34, whereby the perephiral velocity of wheel 12 and guide roller 22 are equal.

Depending upon the signals obtained from sensors 27 and 28 can, when a relative shift of position of masking belt 15 and product strip 16 is required, motor 35 be energized to effect a displacement of wheel 12 rotating on shaft 34 with gear wheel 32, in one or the other direction, so that wheel 32 will rotate a little slower or faster than gear wheel 32. As a result of this also the travel speed of masking belt 15 will be decelerated or accelerated because the masking belt, resting against or about friction layer 13 will follow all movements of wheel 12. In this manner a relative corrective shift of the position of the masking belt 15 towards product strip 16 can be obtained, ensuring the correct position of windows 11 or $11^1$ in the masking belt versus the leads 7 or 8 of products 2 (FIG. 1).

In practical operation both guide rollers 19 and 22 as well as the wheel 12 will generally be driven by individual motors, and in such a manner that motor 29 of guide roller 22 will generally rotate at constant r.p.m. to ensure a constant travel speed of product strip 16 through the apparatus. Deviations detected by sensors 27 and 28 will then be transferred into signals which will by means of an electronic circuit regulate the speed of revolutions of motor 35, driving wheel 12, as required.

It has been proven in practical operation that, using the construction described above, a very constant tension in the product strip can be maintained, whilst the small relative shifts in position of masking belt versus product strip do not have any negative effect whatsoever on the products in the product strip, and that by means of the proximity sensors 27 and 28 through which the positions masking belt 15 and product strip 16 respectively are detected, a very accurate adjustment to the correct position of masking belt 15 versus product strip 16 at the location of electrolyte sparger 25 can be obtained, resulting in an optimum selective metal deposition on the leads 7 or 8.

A theoretical objection against utilizing a wheel or drum-shaped carrier 12 could be the difference of average diameter between the masking belt 15 (DM FIG. 6) and TAB film 16 (DT FIG. 6) on the periphery of the wheel. In practice however this theoretical problem appears to present no problem at all. When utilizing an outside diameter of wheel 12 with friction layer 13 of e.g. 250 mm., a frequently used masking belt thickness of 0.075 and a TAB film of 0.075 mm laminated to a copperfoil of 0.035 mm, total thickness therefore 0,110 mm. DT will be equal to $250+(2+\frac{1}{2}+0.110)+2+0.075$ or 250.260, and DM to $250+(2+\frac{1}{2}+0.075)$ or 250.075 mm.

The difference in length of the engaged portions of product strip and masking belt on wheel 12 when utilizing half of the periphery of the wheel as the active section will be $\frac{1}{2}+3.14 +(250.260-250.075)=0.03$ mm.

This comes down to a location accuracy of ±0,150 mm which in it self is amply adequate in practice. Moreover however the masking belt 15 can be kept under a low tension resulting in a slight elastic increase in length. Even with a minimum preset tension of 100 gram an elongation of 0.103 mm of masking belt 15 is obtained of the portion of it abut to the wheel which results in a reduction of the location accuracy to appr. ±0.1 mm.

Experiments to try by means of increasing the tension in masking belt 15 to equalize the difference in length between masking belt and product strip in the area in direct contact with the wheel periphery proved unsuccessful because, due to the many perforations and windows in the masking belt 15, undesirable deformations occurred. In the example described above a tension of 300 grams was easily permissible and even desirable to obtain good engagement of masking belt 15 against friction layer 13 of wheel 12.

As has been explained before, use is made of the transport or sprocket holes normally present in masking belts 15 and product strip 16 to detect a possible necessity for a relative shift in position by means of sensors 27 and 28. It will be evident however that if desired other windows or perforations can be utilized to act in concert with the sensors.

Further, instead of optical sensors, other forms of proximity sensors can be used, e.g. sensors jetting compressed air against belt of strip which react upon the presence or absence of a perforation in belt or strip.

Within the scope of this invention alternatives or additions are possible to the described design and construction of the apparatus of the present invention, as will be demonstrated but not limited to by means of FIG. 7-10. In these figures, parts which are identical to those described in FIG. 4 and 6 have been given the same part numbers as in FIG. 4 and 6.

Figure 7:
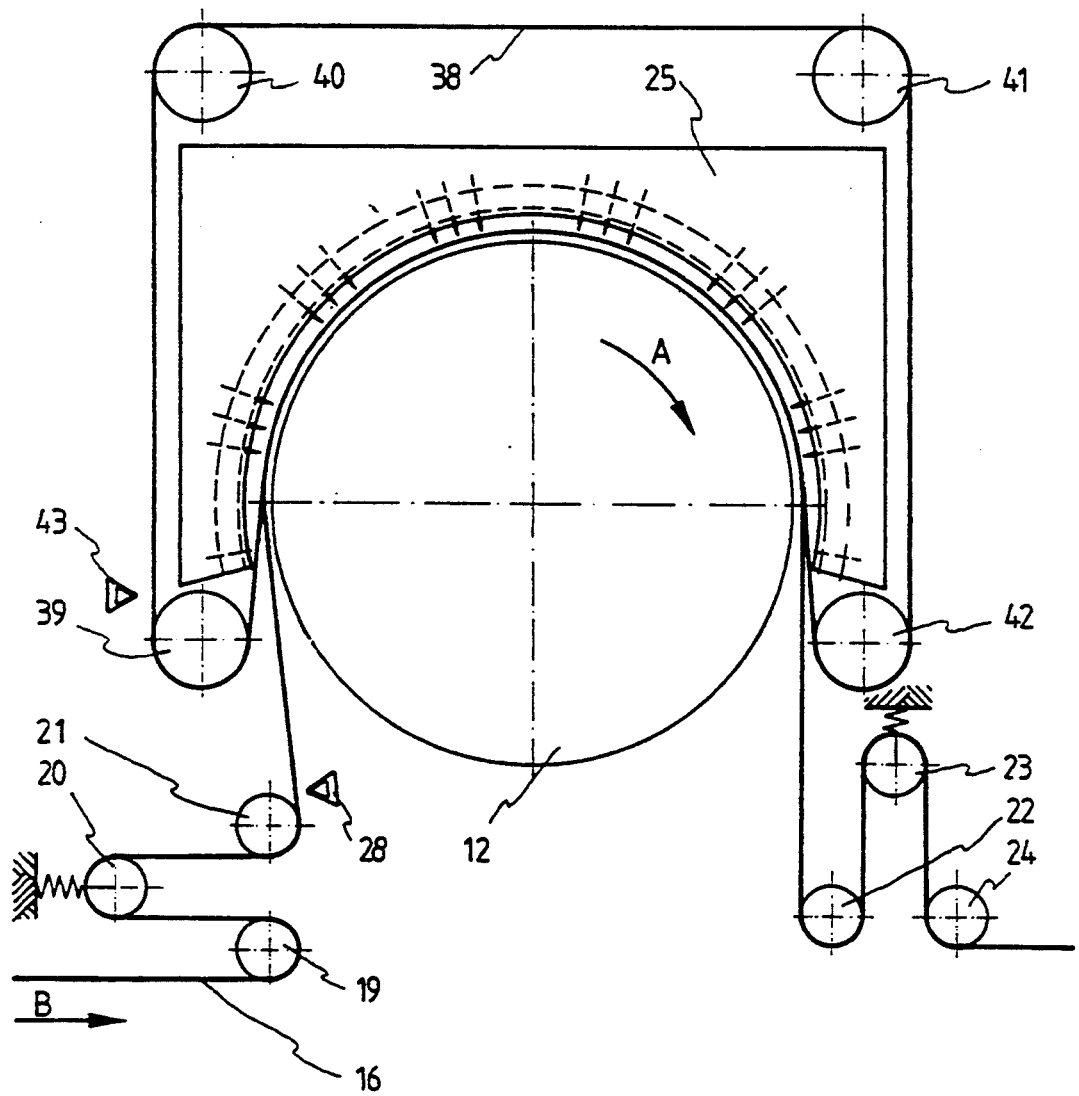
FIG. 7 shows schematically a view of an alternative form for use of the apparatus of the invention.
Figure 8:
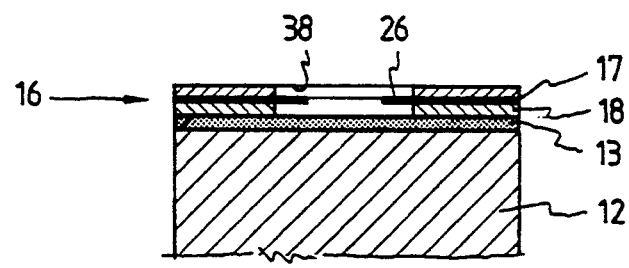
FIG. 8 shows schematically a cross section over a part of the wheel with adjacent product strip and masking belt abut of the apparatus of FIG. 7.
Figure 9:
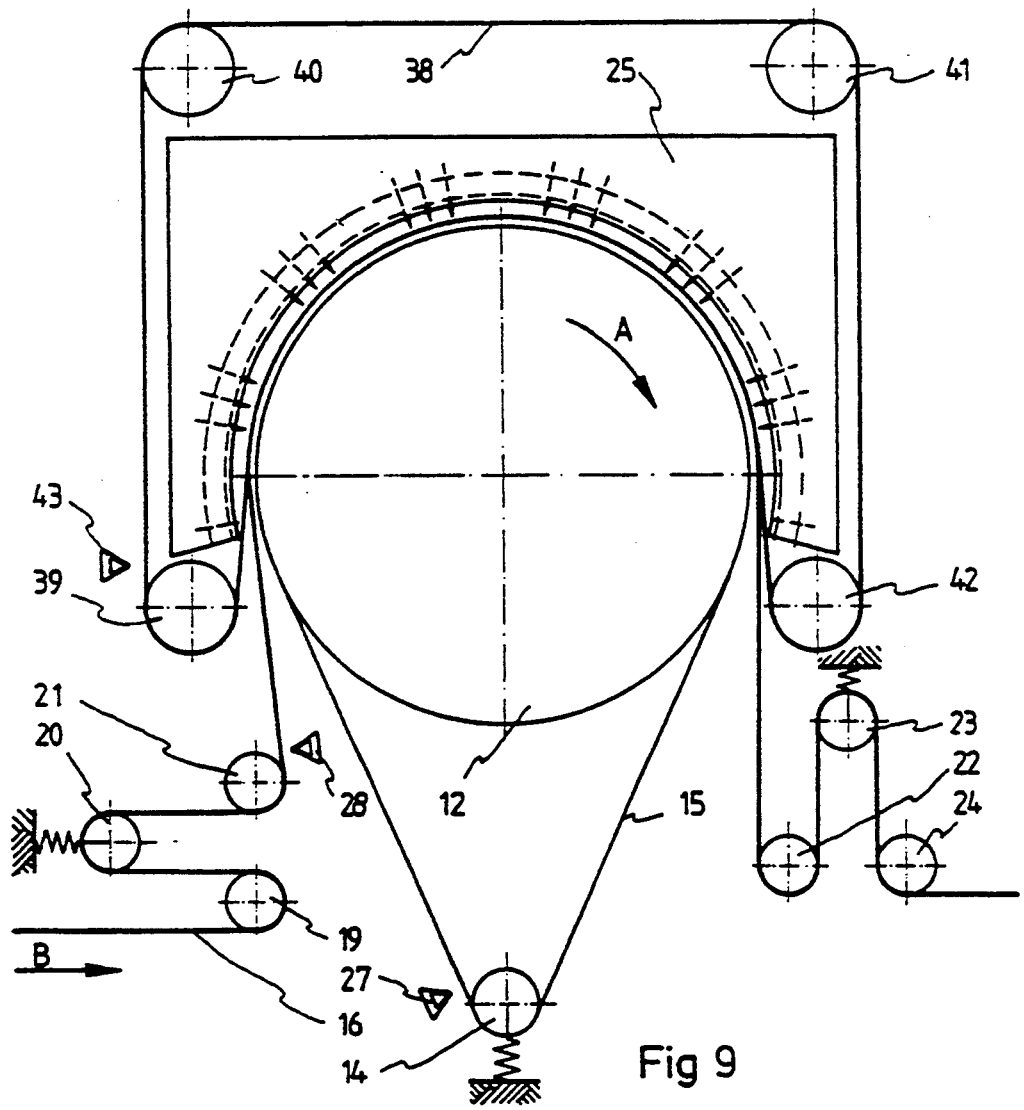
FIG. 9 shows schematically a view of a second alternative form for use of the apparatus of the invention.
Figure 10:
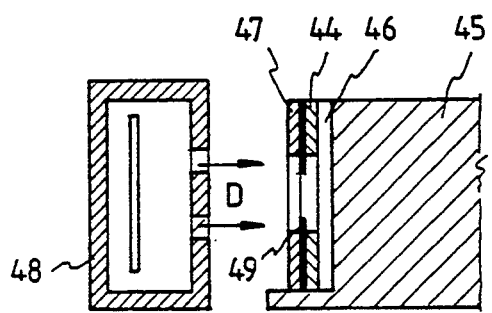
FIG. 10 shows a top view of a part of an elongated product strip 1 which is formed of a number of interconnected metal structures or leadframes 2 which are used in the production of integrated circuits.

FIG. 7 and 8 shows a construction whereby the plastic film side 18 of a product strip 16 extends around or rests against the friction layer 13 of wheel 12. A masking belt 38 covers the outside of product strip 16, whereby the part of product strip 16 engaged with the wheel is clamped between friction layer 13 and masking belt 38.

Masking belt 38 is guided around the apparatus by means of 4 guide rollers 39–42. Nearby guide wheel 39 a sensor 43 is situated to detect the position of masking belt 38 and to produce signals which together with signals produced by sensor 28, which detects the position of product strip 16, cause, when required a relative correction of masking belt versus product strip lengthwise to take place, identical as has been described before. In this case e.g. a driving motor can be connected to guide roller 39 by means of which masking belt 38 can be driven and if and when required can adjust the speed of masking belt 38. A further alternative construction form of the invention is demonstrated in FIG. 9. It will be clear from this figure that in this construction product strip 16 is sandwiched between masking belt 15 as the described in relation with FIG. 4 and masking belt 38 from FIG. 7 and 8. The operation of this construction will be identical to the operation of the apparatus described above.

Although in the description of the invention above the application of the selective electroplating has been related mainly to TAB films it will be evident to those skilled-in the art that other combinations of plastic films and metal structures, such as but not limited to flexible printed circuits (flex circuits) can be processed with the same apparatus and method.

We claim:

1. A method for selective electroplating of metal on metal or metallized products in an elongated strip comprising the steps of:

guiding a masking belt and a product strip together about a periphery of a wheel or drum and along means for exposing the products to be plated to an electrolyte, with the wheel or drum having a layer of a material with a high coefficient of friction which contacts the masking belt or product strip;

providing the masking belt and the product strip with holes arranged in a regular lengthwise pattern;

providing drive means for lengthwise transport of the masking belt and product strip;

producing a first signal which indicates the position of holes in the masking belt sensed by a first proximity sensor at a first location, which seen in the traveling direction of the masking belt and product strip is upstream and nearby the wheel or drum and the means for exposing the product strip to the electrolyte;

producing a second signal which indicates the position of holes in the product strip sensed by a second proximity sensor at a second location, which seen in the traveling direction of the masking belt and product strip is upstream and nearby the wheel or drum;

exposing the product strip to the electrolyte; and influencing the driving means to make relative lengthwise movement between the masking belt and product strip relative to each other when said first and second proximity sensors signal deviation from a targeted position of the masking belt and product strip relative to each other.

2. The method of claim 1, wherein the steps of producing signals indicating the position of holes include utilizing transport holes as said holes.

3. The method of claim 1 or claim 17, wherein the steps of producing signals include utilizing optical sensors as said proximity sensors for indicating the position of holes.

4. The method of claim 1, wherein the guiding step includes placing said masking belt into direct contact with said wheel or drum, with the product strip placed along a side of the masking belt which is remote from the wheel or drum.

5. The method of claim 1, wherein the guiding step includes passing the product strip over the wheel or drum between two masking belts which are each passed over the wheel or drum.

6. An apparatus for selective electroplating of metals on metal or metallized products in an elongated strip comprising:

means for guiding a masking belt and a product strip together about a periphery of a wheel or drum and along means for exposing the products to be plated by an electrolyte, said wheel or drum having a layer of a material with a high coefficient of friction which contacts the masking belt or product strip;

means for exposing the product strip to the electrolyte;

a first proximity sensor disposed at a first location, which seen in the traveling direction of the masking belt and product strip is upstream and nearby the wheel or drum and the means for exposing the product strip to the electrolyte, said first proximity sensor producing a first signal which indicates the position of holes in the masking belt;

a second proximity sensor disposed at a second location, which seen in the traveling direction of the masking belt and product strip is upstream and nearby the wheel or drum, said second proximity sensor producing a second signal which indicates the position of holes in the product strip;

drive means for lengthwise transport of the masking belt and product strip; and means for influencing the driving means to cause relative lengthwise movement between the masking belt and product strip in relation to each other in response to said first and second proximity sensors signaling a deviation from a targeted position of the masking belt and product strip with respect to each other.

7. The apparatus of claim 6, further including a spring-supported tensioning wheel over which said masking belt travels.

8. The apparatus of claim 6 or claim 7, further including means for guiding two of said masking belts, with said product strip located between said masking belts.

9. The apparatus of claim 6 or claim 7, further including spring-supported tensioning wheels located upstream and downstream of said wheel or drum for guiding the product strip.

10. An electroplating method, utilizing a masking belt, in which metal coatings are applied to metal products which are connected on an elongated product strip, the method comprising:

providing as the product strip a plastic film having windows upon which the metal products are supported;

providing said mask belt having windows for exposing parts of the metal products supported by said product strip;

exposing said metal products to an electrolyte through said masking belt to thereby apply a metal coating upon said metal products;

wherein the step of providing said masking belt includes providing said masking belt of a material corresponding to the material from which the plastic film of said product strip is made, with said masking belt having substantially the same thickness as said plastic film of said product strip;

the method further including forming the windows provided in the masking belt and forming the windows in the plastic film of the product strip utilizing the same means.

11. The method of claim 10, wherein said masking belt is formed of polyimide, and has a thickness of approximately 0.05–0.15 mm.

12. A method for selective electroplating of metals on metal or metallized products comprising:

providing a product strip having metal or metallized products therein formed to a desired shape by chemical etching and interconnected by a plastic film;

providing a masking belt, said masking belt having windows and disposing said masking belt adjacent to said product strip while passing said masking belt and product strip through an apparatus for exposing the product strip to an electrolyte such that parts of the metal product not covered by said masking belt are exposed to an electrolyte to thereby apply a metal coating;

wherein the step of providing a masking belt includes providing a masking belt of a plastic film formed of a material corresponding to the plastic film of said product strip, the step of providing a masking belt further including providing as the plastic film of the masking belt a plastic film having at least substantially the same thickness as the plastic film of the product strip.

13. The method of claim 12, wherein said plastic film of the product strip is formed of polyimide.

14. The method of claim 17 or claim 28, wherein the plastic film of the product strip and the plastic film of the masking belt have a thickness of approximately 0.05–0.15 mm.

\* \* \* \* \*